(12) United States Patent
Metzger

(10) Patent No.: US 6,230,106 B1
(45) Date of Patent: May 8, 2001

(54) METHOD OF CHARACTERIZING A DEVICE UNDER TEST

(75) Inventor: Donald William Metzger, Colorado Springs, CO (US)

(73) Assignee: Modulation Instruments

(*) Notice: Subject to any disclaimer, the term of this patent is extended or adjusted under 35 U.S.C. 154(b) by 0 days.

(21) Appl. No.: 09/419,012

(22) Filed: Oct. 13, 1999

(51) Int. Cl.⁷ .................................................. G01R 35/00
(52) U.S. Cl. ............................................. 702/85; 324/601
(58) Field of Search ........................... 702/85, 104, 107; 324/601, 602, 603, 629, 649

(56) References Cited

U.S. PATENT DOCUMENTS

| | | | |
|---|---|---|---|
| 3,990,004 | 11/1976 | Newton | 324/57 |
| 4,414,638 | 11/1983 | Talambiras | 364/571 |
| 4,703,433 | 10/1987 | Sharrit | 324/485 |
| 4,982,164 | 1/1991 | Schiek et al. | 324/638 |
| 5,097,215 | 3/1992 | Eul et al. | 324/601 |
| 5,175,698 | 12/1992 | Barbanell | 364/553 |
| 5,332,974 | 7/1994 | Harkins et al. | 324/606 |
| 5,434,511 | 7/1995 | Adamian et al. | 324/601 |
| 5,548,538 | 8/1996 | Grace et al. | 364/571.04 |
| 5,608,330 * | 3/1997 | Heuermann et al. | 324/601 |
| 5,646,536 * | 7/1997 | Ishihara | 324/601 |
| 5,748,506 | 5/1998 | Bockelman | 364/1.02 |
| 5,784,299 | 7/1998 | Evers et al. | 364/571.01 |
| 5,793,212 * | 8/1998 | Bockelman et al. | 324/601 |
| 5,937,006 * | 8/1999 | Clark et al. | 375/224 |
| 6,081,125 * | 6/2000 | Krekels et al. | 324/601 |
| 6,147,501 * | 11/2000 | Chodora | 324/601 |

\* cited by examiner

*Primary Examiner*—Patrick Assouad
(74) *Attorney, Agent, or Firm*—Dale B Halling

(57) ABSTRACT

A method of characterizing a device under test involves the steps of first inserting a calibration standard in a test setup. Second, a calibration signal is applied to the test setup. Third, a number of vector error correction coefficients are determined. Fourth, the device under test is inserted in the test setup. Fifth, a non-sinusoidal signal is applied to the test setup. Sixth, a response to the non-sinusoidal signal is measured.

20 Claims, 7 Drawing Sheets

Input mentation of an output signal with the effects of the test

METHOD OF CHARACTERIZING A DEVICE UNDER TEST

STATEMENT OF GOVERNMENT INTERESTS

This invention was made with Government support under Contract No. F29601-96-C-0012 awarded by the Air Force. The Government has certain rights in the invention.

FIELD OF THE INVENTION

The present invention relates generally to the field of testing methods and more particularly to a method of characterizing a device under test.

BACKGROUND OF THE INVENTION

Testing of high frequency devices (circuits) requires that the user first characterize the test setup. Once the effects of the test setup are known they can be eliminated from a measured response to determine the response of the device under test. Commonly, all the fixturing associated with a test setup is assumed to be a linear network. A well known calibration standard is inserted into the test setup and a sine wave of a first frequency is applied to the test setup. The response of the calibration standard and test setup together are measured. The test setup is characterized by a plurality of coefficients that describe the test setup's effect on the input and output signals. This is repeated for a number of frequencies and may be repeated for several calibration standards. The device under test is then inserted into the test setup and the response to a sine wave input at a number of frequencies is measured. The measured response is adjusted by the known properties of test setup and the device under test is characterized. Unfortunately, real input signals typically are not sine waves, but have multiple frequencies. Real input signals are modulated or imperfect square waves. As a result a user does not obtain a picture of a real output when using sine wave inputs. In addition, it has been found that real devices (circuits) often have non-linear responses to real-world signals. When real devices are tested with sine waves, an inaccurate model of the device is formed.

Thus there exists a need for a method of testing electronic devices that provides the user with a real output and characterizes the device under operating conditions.

DETAILED DESCRIPTION OF THE DRAWINGS

The invention is a method of characterizing a device under test. The method involves the steps of first inserting a calibration standard in a test setup. Second, a calibration signal is applied to the test setup. Third, a number of vector error correction coefficients are determined. Fourth, the device under test is inserted in the test setup. Fifth, a non-sinusoidal signal is applied to the test setup. Sixth, a response to the non-sinusoidal signal is measured. In one embodiment, the response is adjusted by the vector error correction coefficients to determine a mathematical model of the device under test. In another embodiment the response is adjusted by the vector error correction coefficients to form a model of the actual output of the device under test. Note that the input signal is a non-sinusoidal signal (real world signal). As a result, the device is characterized for real world conditions and the calculated actual output is a real world signal.

Figure 1:
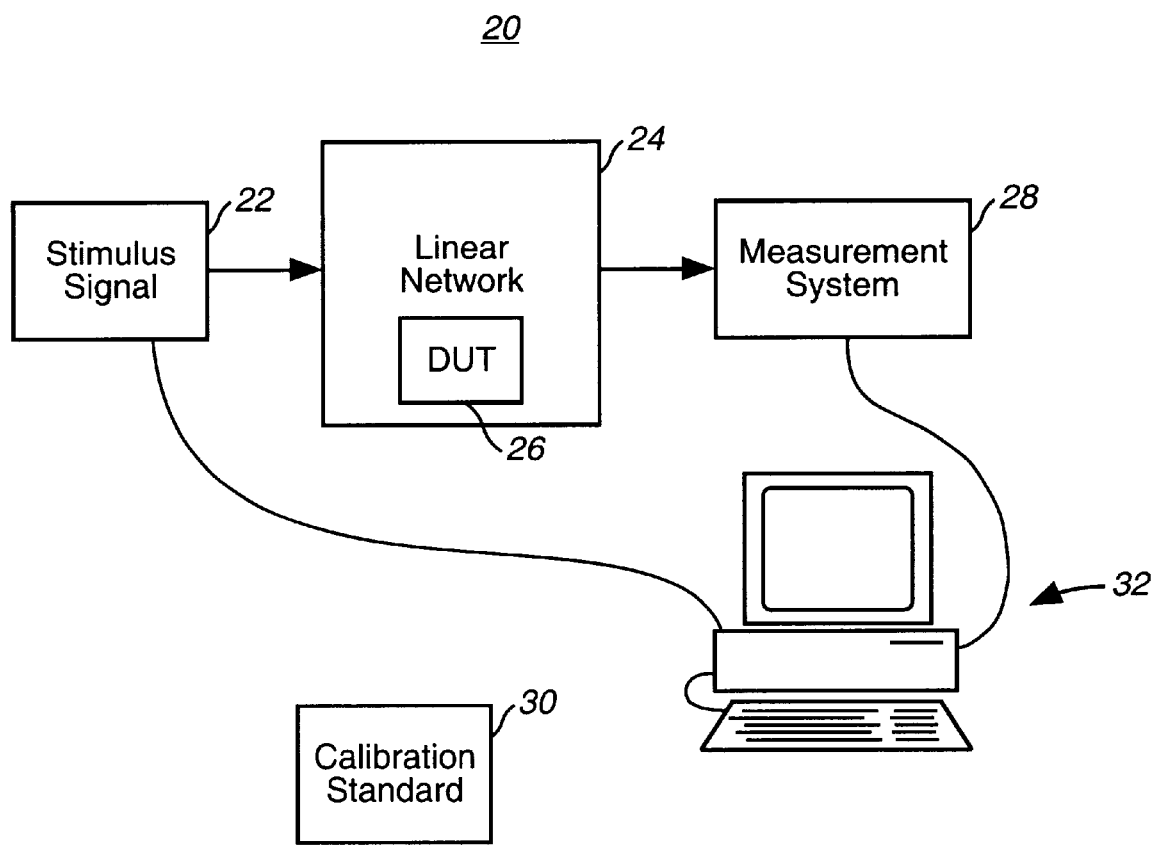
FIG. 1 is a block diagram of a test setup capable of implementing the invention in accordance with one embodiment of the invention.

FIG. 1 is a block diagram of a test setup 20 capable of implementing the invention in accordance with one embodiment of the invention. A stimulus signal 22 is applied to a linear network 24. A device under test (DUT) 26 is embedded in the linear network 24. A measurement system 28 measures the response of the linear network 24 and the device under test 26. A calibration standard 30 is used to characterize the linear network so that the effects of the linear network on the stimulus signal 22 can be separated from the effects of the device under test 26. A computer 32 is connected to the stimulus signal device 22 and the measurement system 28. The computer 32 provides both control functions and analysis functions. The computer 32 can be used to automate the method described herein.

Figure 2:
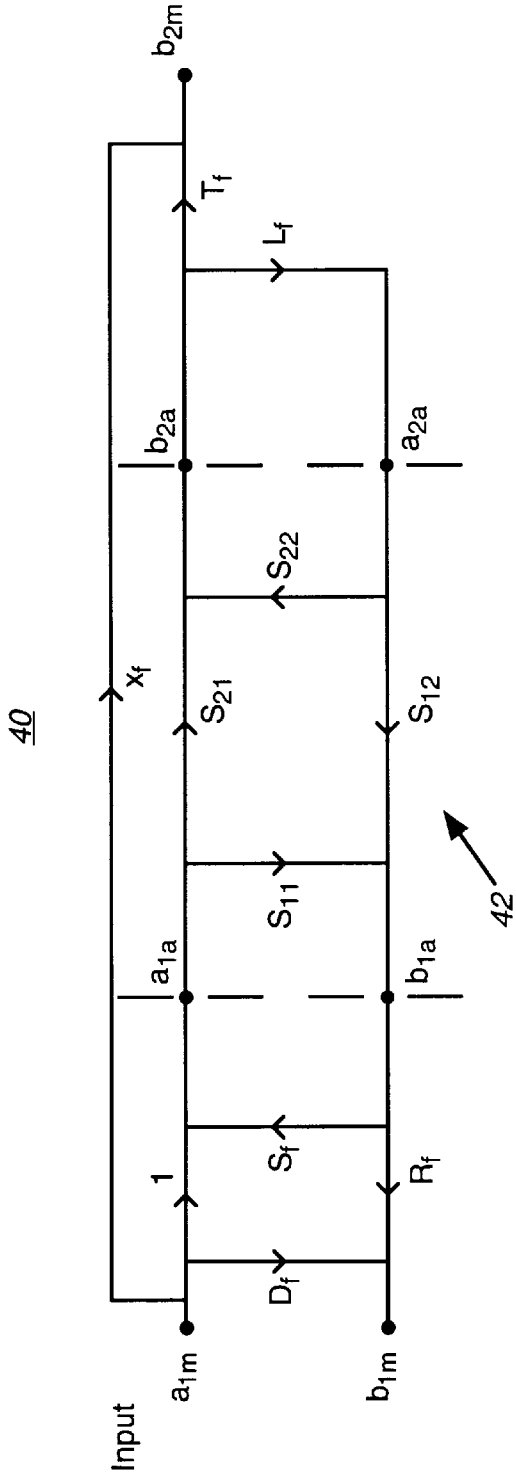
FIG. 2 is a schematic diagram of the test setup of FIG. 1 in accordance with one embodiment of the invention.

FIG. 2 is a schematic diagram 40 of the test setup of FIG. 1 in accordance with one embodiment of the invention. This model is a six (twelve) coefficient error model. The vector error correction coefficients are $D_f$, $S_f$, $R_f$, $X_f$, $T_f$, $L_f$ where the subscript "f" stands for a forward measurement. The device under test 42 transfer function coefficients. are $S_{11}$, $S_{12}$, $S_{21}$, $S_{22}$. Note that when a calibration standard is inserted into test setup the transfer function coefficients $S_{11}$, $S_{12}$, $S_{21}$, $S_{22}$ for the calibration standard are partially or fully known. An input signal is applied at $a_{1m}$, where the subscript m stands for measured. The reflected signal is measured at $b_{1m}$. An output signal is measured at $b_{2m}$. As a result, if the test setup vector error coefficients are known we have four unknowns ($S_{11}$, $S_{12}$, $S_{21}$, $S_{22}$) and three knowns ($a_{1m}$, $b_{1m}$, $b_{2m}$). As a result it is necessary to make measurements with the input signal applied to the output of the input device 42. Note $a_{1a}$, $b_{1a}$, $a_{2a}$, $b_{2a}$ are the actual values at the input and output of the device under test 42.

Figure 3:
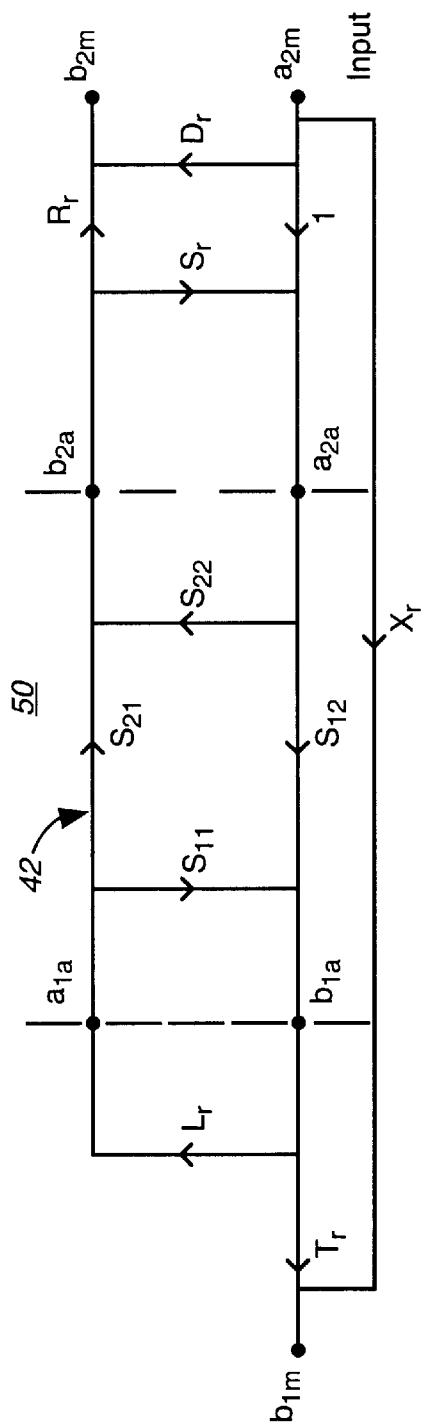
FIG. 3 is a schematic diagram of the test setup of FIG. 1 with an input signal applied to an output of the device under test in accordance with one embodiment of the invention.

FIG. 3 is a schematic diagram 50 of the test setup of FIG. 1 with input signal applied to an output of the device under test in accordance with one embodiment of the invention. Applying the input signal to the output of the device under test 42 results in six new vector error correction coefficients: $D_r$, $S_r$, $R_r$, $X_r$, $T_r$, $L_r$ where the subscript "r" stands for a reverse measurement. The device under test's 42 transfer function coefficients are ($S_{11}$, $S_{12}$, $S_{21}$, $S_{22}$) the same as in the forward case. We now have six measurements and four unknowns. As a result we can solve for the transfer function coefficients ($S_{11}$, $S_{12}$, $S_{21}$, $S_{22}$). Note that the transfer functions and the vector error correction coefficients are functions of frequency. As a result these have to be solved for several frequencies in the frequency range of interest. The invention is not limited to a twelve error coefficient model and other vector error models will work equally well with the invention.

Figure 4:
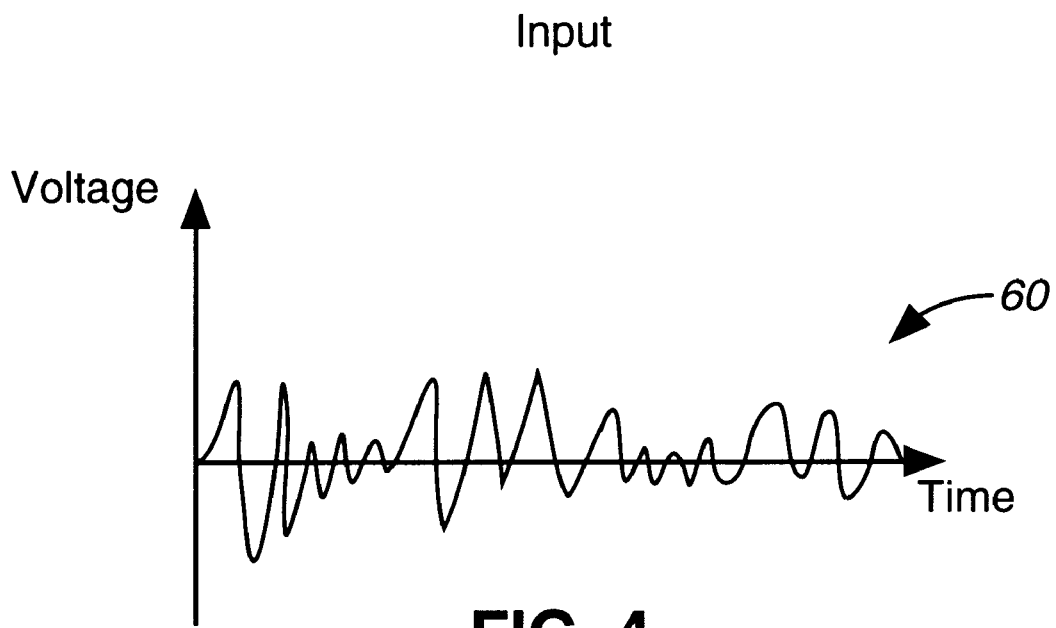
FIG. 4 is a graphic representation of a time domain representation of an input signal in accordance with one embodiment of the invention.
Figure 5:
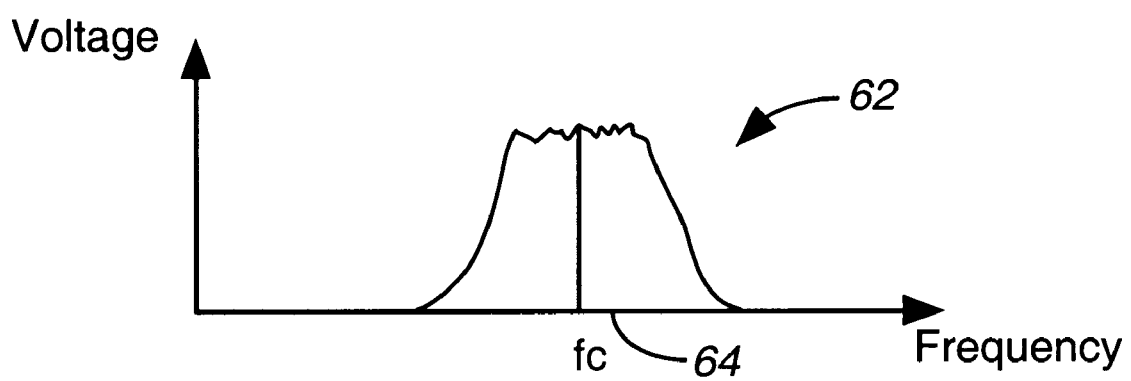
FIG. 5 is a graphic representation of a frequency domain representation of an input signal in accordance with one embodiment of the invention.

FIG. 4 is a graphic representation of a time domain representation of an input signal 60 in accordance with one embodiment of the invention. Note that the graph depicts the voltage as a function of time. The input signal is a non-sinusoidal signal (real world signal, modulated signal). FIG. 5 is a graphic representation of a frequency domain representation of an input signal 62 in accordance with one embodiment of the invention. The graph shows the voltage (power) of the signal at any particular frequency. A carrier (center) frequency 64 is shown in the middle of the curve. Thus the signal includes a broadband spectrum of frequencies, rather than the single frequency of the prior art. When this real world signal is applied to a device under test, the output incorporates the non-linear effects of the device under test. A user solving for the transfer function coefficients ($S_{11}$, $S_{12}$, $S_{21}$, $S_{22}$) obtains results of how the device responds to a real signal.

Figure 6:
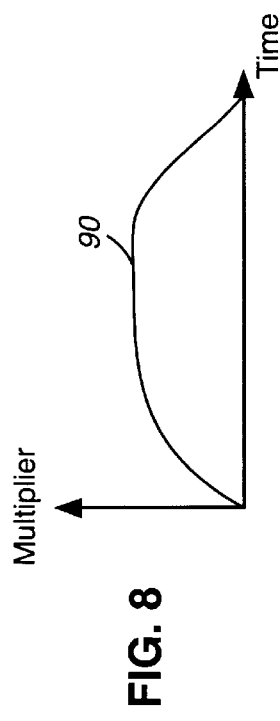
FIG. 6 is a graphic representation of a time domain representation of an output signal in accordance with one embodiment of the invention.
Figure 7:
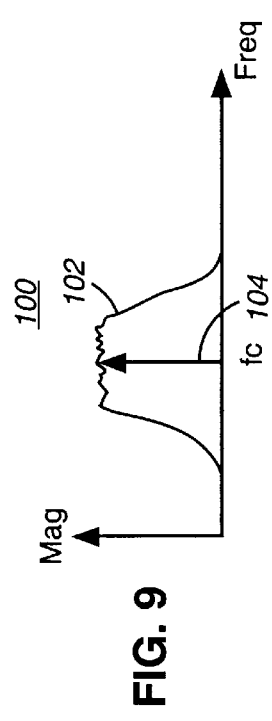
FIG. 7 is a graphic representation of a frequency domain representation of an output signal with the effects of the test setup removed in accordance with one embodiment of the invention.
Figure 8:
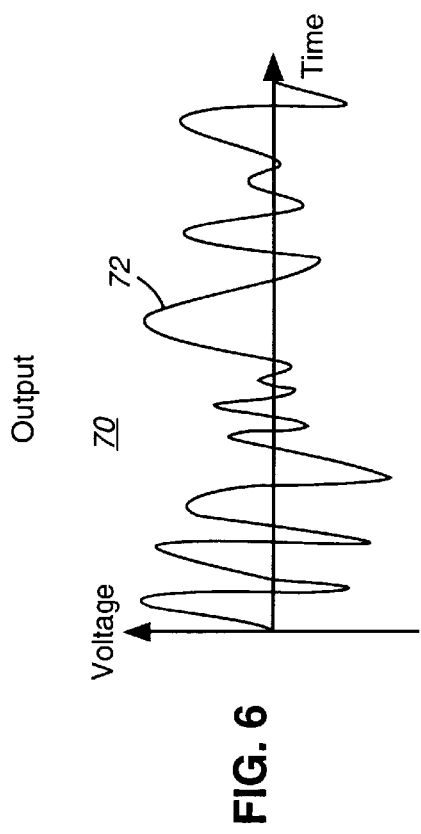
FIG. 8 is a graphic representation of a windowing function in accordance with one embodiment of the invention.
Figure 9:
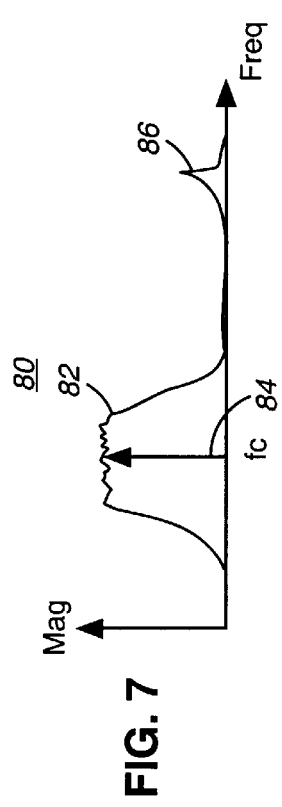
FIG. 9 is a graphic representation of a frequency domain representation of an output signal with the effects of the test setup removed that has been multiplied by the window function of FIG. 8 in accordance with one embodiment of the invention.
Figure 10:
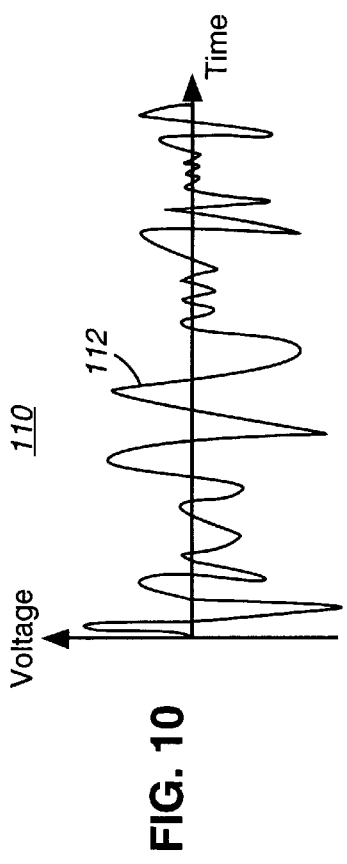
FIG. 10 is a graphic representation of a time domain representation of the output signal adjusted for the effects of the test setup in accordance with one embodiment of the invention.

FIG. 6 is a graphic representation of a time domain representation 70 of an output signal 72 in accordance with one embodiment of the invention. The graph shows the signal 72 as it would appear on an oscilloscope. The signal 72 incorporates all the effects of the test setup. FIG. 7 is a graphic representation of a frequency domain representation 80 of an output signal 82 with the effects of the test setup removed in accordance with one embodiment of the invention. The graph shows the signal 82 as it would appear after performing an FFT, DFT, etc. (Fast Fourier Transform; Discrete Fourier Transform) and adjusting for the test setup using the vector error correction coefficients. The vector error correction coefficients are function of frequency, as a result it is easier to compensate for them in the frequency domain. The carrier frequency 84 is shown on the graph. Note the other high frequency peaks 86 that are due to truncating the signal 72. Commonly the high frequency peaks 86 are eliminated by using a windowing function. FIG. 8 is a graphic representation of a windowing function 90 in accordance with one embodiment of the invention. The window function 90 is multiplied by the output signal 72 before an FFT is performed. FIG. 9 is a graphic representation of a frequency domain representation 100 of an output signal 102 with the effects of the test setup removed that has been multiplied by the window function of FIG. 8 in accordance with one embodiment of the invention. Note that the high frequency peaks are gone but the basic shape is the same. The carrier frequency 104 is still shown and is unaltered by the windowing function. FIG. 9 provides the user with the most accurate picture of how the device will behave in response to a real world input. FIG. 9 is also used to determine the transfer function coefficients ($S_{11}$, $S_{12}$, $S_{21}$, $S_{22}$) for the device under test. When a user desires to see a real time representation of the output signal undistorted by the test setup, an inverse Fourier transform is performed on the non-windowed FFT of FIG. 7. FIG. 10 is a graphic representation of a time domain representation 110 of the output signal 112 adjusted for the effects of the test setup in accordance with one embodiment of the invention. Note that all the signals are representative and are not actual signals. The reason for performing the inverse FFT on the signal of FIG. 7 instead of the signal of FIG. 9 is that the windowing function distorts the time domain representation. Thus FIG. 10 provides the user with a real time-domain output of the device under test. The prior art does not provide a real time-domain output waveform of the device under test. This significantly increases the understanding the user has of the device under test.

Figure 11:
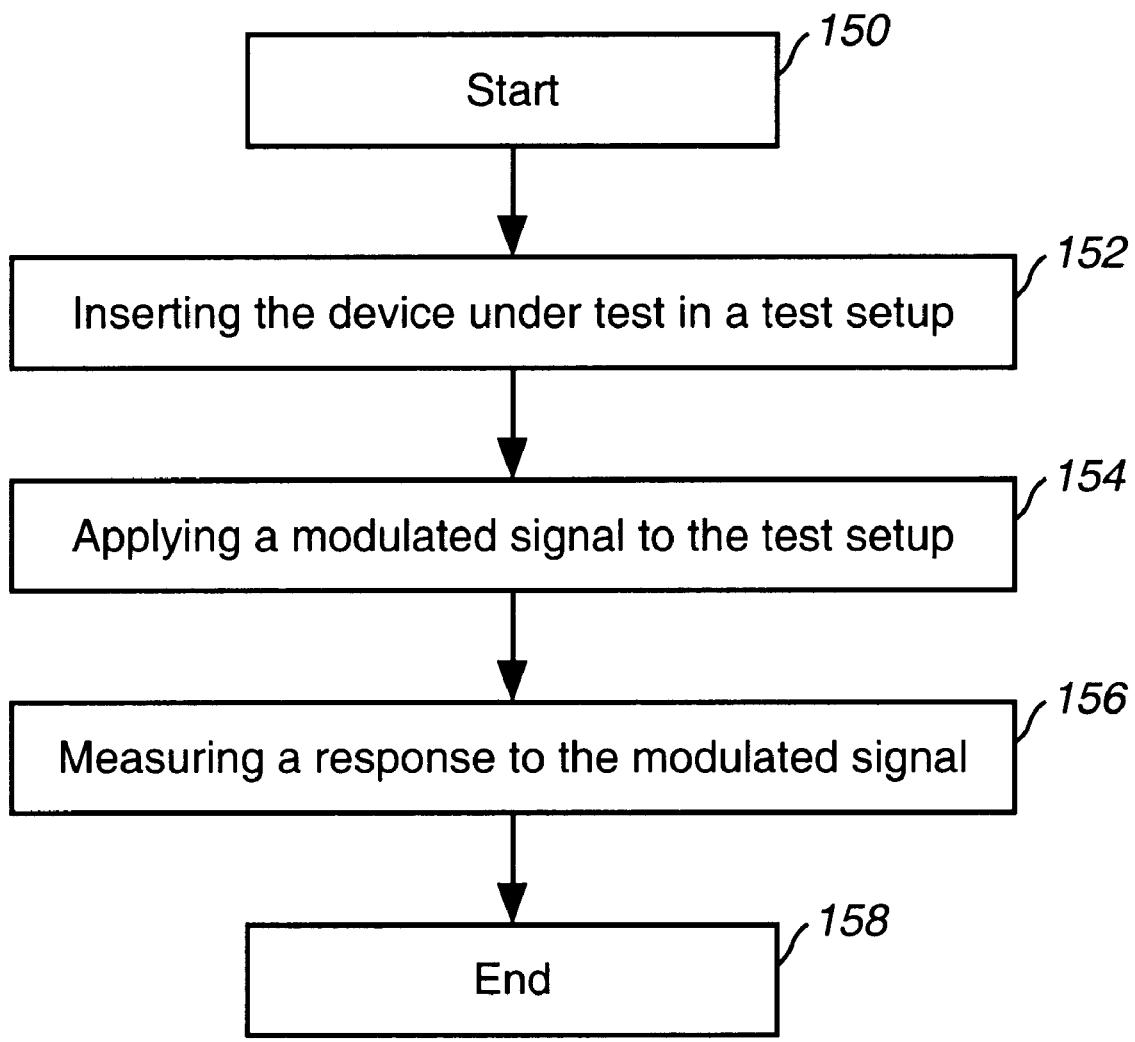
FIG. 11 is a flow chart of the steps used in a method of characterizing a device under test in accordance with one embodiment of the invention.

FIG. 11 is a flow chart of the steps used in a method of characterizing a device under test in accordance with one embodiment of the invention. The process starts, step 150, by inserting the device under test in a test setup at step 152. A modulated signal is applied to the test setup at step 154. At step 156, the response to the modulated signal is measured which ends the process at step 158. In one embodiment a calibration standard is inserted in a test setup. A calibration signal is applied to the test setup. A vector error correction model for the test setup is determined. The vector error correction model includes vector error coefficients for a number of frequencies in the range of interest.

In another embodiment, the response is converted to a frequency domain to form a frequency domain output. The vector error correction model is applied to the frequency domain output to form a vector error corrected frequency domain output. A time domain representation of the vector error corrected frequency domain output is calculated.

In one embodiment the response is digitized to form a digitized output. The digitized output is windowed to form a window output. The window output is converted to a frequency domain representation to form a frequency output. The vector error correction model is applied to the frequency output to form a vector error corrected frequency output.

Figure 12:
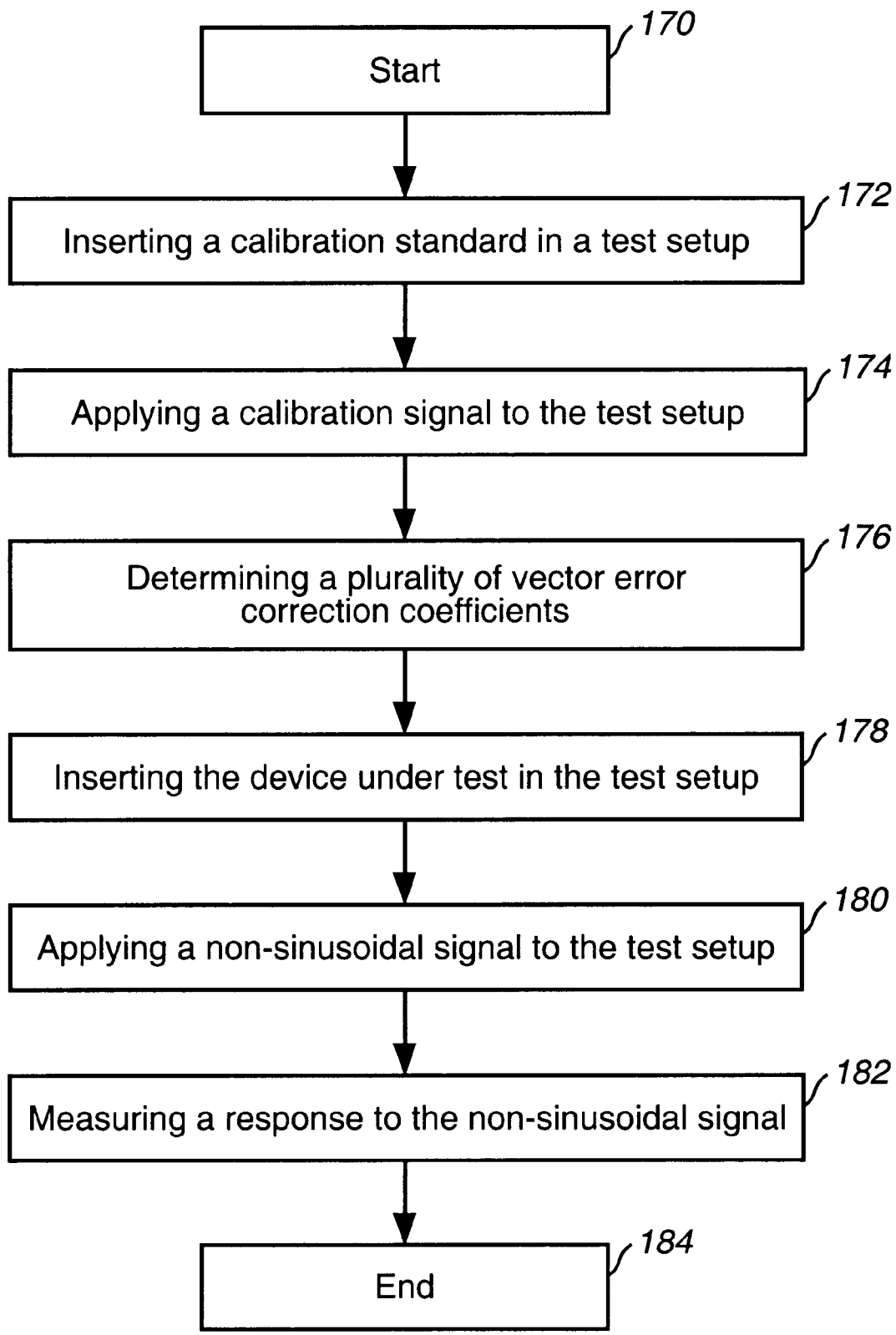
FIG. 12 is a flow chart of the steps used in a method of characterizing a device under test in accordance with one embodiment of the invention.

FIG. 12 is a flow chart of the steps used in a method of characterizing a device under test in accordance with one embodiment of the invention. The process starts, step 170, by inserting a calibration standard in a test setup at step 172. A calibration signal is applied to the test setup at step 174. A plurality of vector error correction coefficients are determined at step 176. The device under test is inserted in the test setup at step 178. A non-sinusoidal signal is applied to the test setup at step 180. At step 182, a response to the non-sinusoidal signal is measured which ends the process at step 184. In one embodiment a vector error corrected output of the device under test is determined. In another embodiment, a sinusoidal signal is applied to the test setup as the calibration signal. In another embodiment, a non-sinusoidal signal is applied to the test setup as the calibration signal. Thus the calibration or vector error correction coefficients can be calculated using either a sinusoidal or non-sinusoidal calibration signal. In another embodiment, a plurality of sinusoidal signals are applied as calibration signals.

In one embodiment a frequency domain representation of the response is determined to form a spectral output. The plurality of vector error correction coefficients are applied to the spectral output to form a vector error corrected spectral output. The vector error corrected spectral output is converted into a vector error corrected time domain output.

Figure 13:
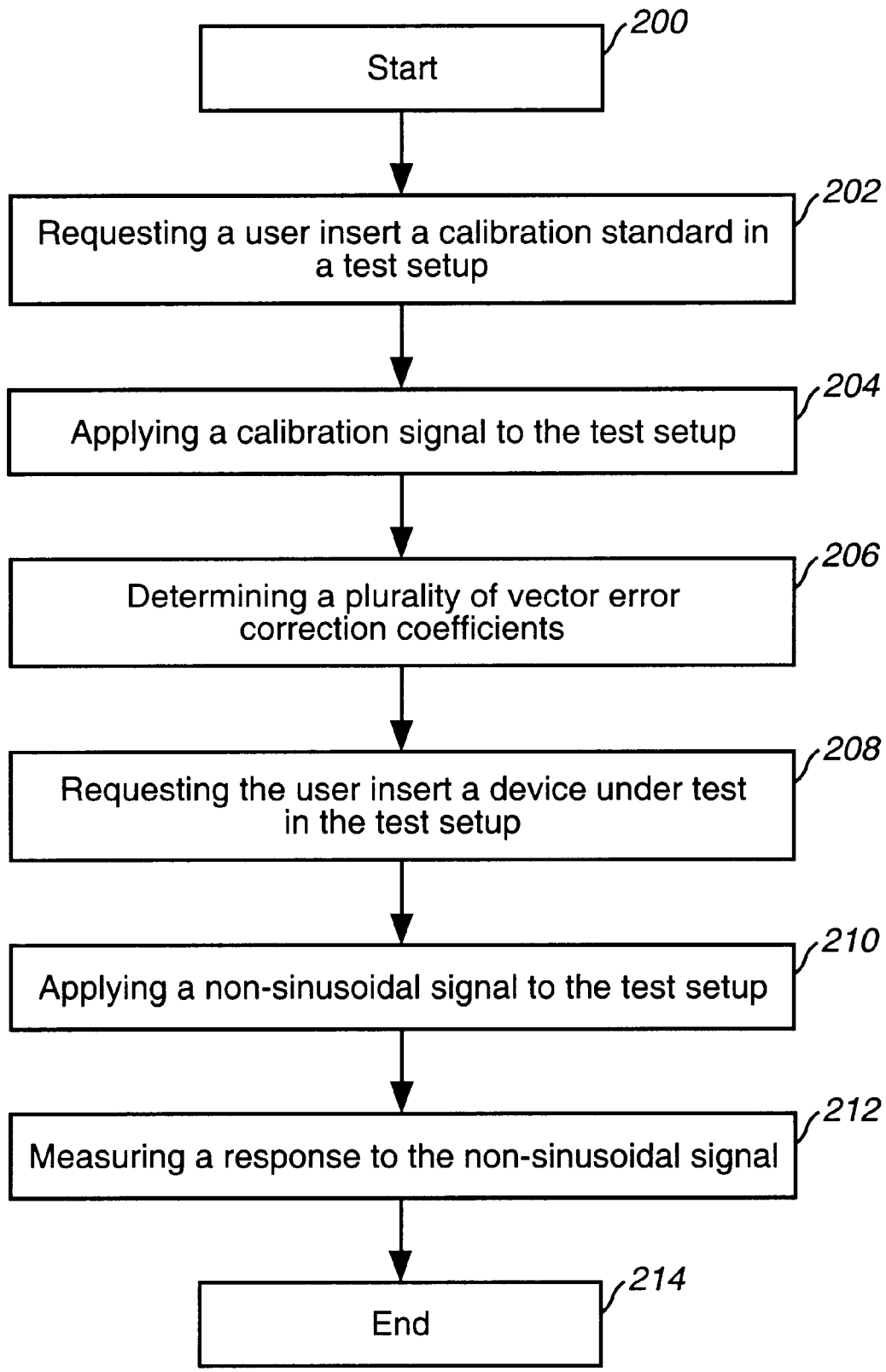
FIG. 13 is a flow chart of the steps used in a method of characterizing a device under test in accordance with one embodiment of the invention.

FIG. 13 is a flow chart of the steps used in a method of characterizing a device under test in accordance with one embodiment of the invention. The process starts, step 200, by requesting a user insert a calibration standard in a test setup at step 202. Note that the calibration standard can be a single artifact or an electronic calibration standard. An electronic calibration standard has a number of artifacts that can be switched into the test setup under control of a computer. A calibration signal is applied to the test setup at step 204. A plurality of vector error correction coefficients is determined at step 206. The user is requested to insert a device under test in the test setup at step 208. A non-sinusoidal signal is applied to the test setup at step 210. At step 212 a response is measured to the non-sinusoidal signal which ends the process at step 214. In one embodiment a plurality of calibration signals are applied to the test setup. A plurality of vector error correction coefficient sets are calculated. A vector error correction coefficient set are the twelve error coefficients of FIGS. 2 and 3 for a given frequency. A vector error correction model of the test setup is formed. The vector error correction model is a group of vector error correction coefficient sets in the frequency range of interest.

In one embodiment, a windowing function is applied to the response to form a window response. A frequency domain representation of the window response is calculated to form a window frequency domain output. The plurality of vector error correction coefficients are applied to the window frequency domain output to form a window vector error corrected frequency domain output.

In one embodiment, a frequency domain representation of the response is calculated to form a frequency domain output. The plurality of vector error correction coefficients are applied to the frequency domain output to form a vector error corrected frequency domain output. A time domain representation of the vector error corrected frequency domain output is calculated to form a vector error corrected time domain output.

Thus there has been described a method of characterizing a device under test that provides a mathematical model of the device response to actual signals. In addition, the method provides a time and frequency domain representation of the output of the device under test, when a real world signal is applied to the device under test. This allows a user to better understand how the device will behave in a real system (circuit).

The methods described herein can be implemented as computer-readable instructions stored on a computer-readable storage medium that when executed by a computer will perform the methods described herein.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A method of characterizing a device under test, comprising the steps of:
    (a) inserting a calibration standard in a test setup;
    (b) applying a calibration signal to the test setup;
    (c) determining a plurality of vector error correction coefficients;
    (d) inserting the device under test in the test setup;
    (e) applying a non-sinusoidal signal to the test setup; and
    (f) measuring a response to the non-sinusoidal signal.

2. The method of claim 1, further including the step of:
    (g) determining a vector error corrected transfer function of the device under test.

3. The method of claim 1, further including the step of:
    (g) determining a vector error corrected output of the device under test.

4. The method of claim 1, wherein step (b) further includes the step of:
    (b1) applying a sinusoidal signal to the test setup.

5. The method of claim 1, wherein step (b) further includes the step of:
    (b1) applying a non-sinusoidal signal to the test setup.

6. The method of claim 1, wherein step (b) further includes the step of:
    (b1) applying a plurality of sinusoidal signals one at a time.

7. The method of claim 1, further including the step of:
    (g) determining a frequency domain representation of the response to form a spectral output.

8. The method of claim 1, further including the step of:
    (h) applying the plurality of vector error correction coefficients to the spectral output to form a vector error corrected spectral output.

9. The method of claim 8, further including the steps of:
    (i) converting the vector error corrected spectral output into a vector error corrected time domain output.

10. A computer readable storage medium containing computer readable instructions that when executing by a computer performs the following steps:
    (a) requesting a user insert a calibration standard in a test setup;
    (b) applying a calibration signal to the test setup;
    (c) determining a plurality of vector error correction coefficients;
    (d) requesting the user insert a device under test in the test setup;
    (e) applying a non-sinusoidal signal to the test setup; and
    (f) measuring a response to the non-sinusoidal signal.

11. The computer readable storage medium of claim 10, wherein step (b) further includes applying a plurality of calibration signals.

12. The computer readable storage medium of claim 11, wherein step (c) further includes the steps of:
    (c1) calculating a plurality of vector error correction coefficient sets;
    (c2) forming a vector error correction model of the test setup.

13. The computer readable storage medium of claim 10, further including the steps of:
    (g) applying a windowing function to the response to form a window response;
    (h) calculating a frequency domain representation of the window response to form a window frequency domain output;
    (i) applying the plurality of vector error correction coefficients to the window frequency domain output to form a window vector error corrected frequency domain output.

14. The computer readable storage medium of claim 10, further including the steps of:
    (g) calculating a frequency domain representation of the response to form a frequency domain output;

(h) applying the plurality of vector error correction coefficients to the frequency domain output to form a vector error corrected frequency domain output;

(i) calculating a time domain representation of the vector error corrected frequency domain output to form a vector error corrected time domain output.

15. A method of characterizing a device under test, comprising the steps of:

(a) inserting the device under test in a test setup;

(b) applying a modulated signal to the test setup; and (c) measuring a response to the modulated signal.

16. The method of claim 15, wherein step (a) further includes the step of:

(a1) inserting a calibration standard in a test setup;

(a2) determining a vector error correction model for the test setup.

17. The method of claim 16, wherein step (a2) includes the step of applying a calibration signal to the test setup.

18. The method of claim 16, further including the steps of:

(d) converting the response to a frequency domain to form a frequency domain output;

(e) applying the vector error correction model to the frequency domain output to form a vector error corrected frequency domain output.

19. The method of claim 18, further including the steps of:

(f) determining a time domain representation of the vector error corrected frequency domain output.

20. The method of claim 18, wherein step (d) further includes the steps of:

(d1) digitizing the response to form a digitized output;

(d2) windowing the digitized output to form a window output;

(d3) converting the window output to a frequency domain representation to form a frequency output;

(d4) applying the vector error correction model to the frequency output to form a vector error corrected frequency output.

* * * * *